US006738260B2

United States Patent
Sivertsen

(10) Patent No.: US 6,738,260 B2
(45) Date of Patent: May 18, 2004

(54) DUAL-CARD RECEIVING DEVICE

(75) Inventor: Clas Gerhard Sivertsen, Lilburn, GA (US)

(73) Assignee: American Megatrends, Inc., Norcross, GA (US)

(*) Notice: Subject to any disclaimer, the term of this patent is extended or adjusted under 35 U.S.C. 154(b) by 0 days.

(21) Appl. No.: 10/105,759

(22) Filed: Mar. 25, 2002

(65) Prior Publication Data

US 2003/0179560 A1 Sep. 25, 2003

(51) Int. Cl.[7] .............................. H05K 1/14; G06F 1/16
(52) U.S. Cl. ....................... 361/740; 361/683; 361/728; 361/732; 361/747; 361/759; 361/807; 361/790; 361/785
(58) Field of Search ................................ 361/683–686, 361/816, 818, 728, 800, 799, 735, 753, 756, 740–742, 747, 758–759, 770, 784, 785, 790, 804, 807, 801, 802, 726, 732; 312/223.1, 223.2; 211/41.17, 26.2

(56) References Cited

U.S. PATENT DOCUMENTS

| | | | |
|---|---|---|---|
| 5,038,308 A | * 8/1991 | Le et al. ...................... 361/796 |
| 5,305,182 A | * 4/1994 | Chen .......................... 361/684 |
| 5,544,006 A | * 8/1996 | Radloff et al. ............... 361/683 |
| 5,748,453 A | 5/1998 | Carney et al. ............... 361/801 |
| 5,943,215 A | * 8/1999 | Carney et al. ............... 361/756 |
| 5,961,618 A | 10/1999 | Kim ........................... 710/101 |
| 6,030,230 A | 2/2000 | Peacock ....................... 439/61 |
| 6,071,143 A | 6/2000 | Barthel et al. .............. 439/377 |
| 6,078,504 A | * 6/2000 | Miles .......................... 361/727 |
| 6,320,760 B1 | 11/2001 | Flamm et al. ............... 361/801 |

OTHER PUBLICATIONS

"Cabinets, Racks, Panels, and Associated Equipment," EIA Standard, Electronics Industries Association, Engineering Department, Sep., 1992, p. 1–18.

* cited by examiner

*Primary Examiner*—Phuong T. Vu
(74) *Attorney, Agent, or Firm*—Merchant & Gould

(57) ABSTRACT

A card receiving system and apparatus for retaining the edges of at least two electronic circuit component cards, in which the cards are preferably positioned horizontally so that one card is disposed above or over the other card and those two cards are oriented substantially parallel to each other. It is noted that this abstract is provided to comply with the rules requiring an abstract that will allow a searcher or other reader to ascertain quickly the subject matter of the technical disclosure. The abstract is submitted with the understanding that it will not be used to interpret or limit the scope or meaning of the claims pursuant to 37 C.F.R. §1.72(b).

20 Claims, 5 Drawing Sheets

DUAL-CARD RECEIVING DEVICE

FIELD OF THE INVENTION

The present invention relates to computing or processing devices using electronic circuit component cards and, more particularly, to computing or processing devices contained within a chassis using a plurality of cards.

BACKGROUND OF THE INVENTION

A variety of state-of-the-art computers, processors, and similar devices use electronic circuit component cards, which are also referred to as electronic cards or card devices. Examples of such electronic circuit component cards include, for example, peripheral component interconnect ("PCI") cards. The industry has developed PCI and the other so-called local bus technologies to provide expansion capabilities to computer systems.

These electronic circuit component cards typically have card edge connectors for mating with the slot connectors on motherboards or backplanes. The card edge connectors and the slot connectors have a corresponding number of relatively closely spaced metal contacts in registry with each other. When the card edge connector is inserted in a slot connector, the corresponding contacts make electrical connection. Through these contacts and their electrical connection, the card device and the motherboard communicate electronically. PCI and similar electronic cards generally derive power from the motherboard or backplane through the card slot into which they are received or plugged.

For a more secure and stable connection, the front edges of the respective cards typically have metal brackets for mounting to a wall or other surface using a bracket and a conventional retainer, such as a screw or a rivet. The brackets and retainers collectively hold the cards stationary relative to the wall, which is particularly important in an environment subject to shock and vibration.

Considering the overall systems, a trend exists in their designs for redundancy and consistency to include duplicative or multiple components, such as multiple power supplies and fans. The redundancy helps to protect against productivity and economic losses associated with system downtime, which is particularly important in computing or processing devices used to perform critical business functions. In a design using redundant parts, one skilled in the art will appreciate that if one component malfunctions or fails, the system may still continue to operate. In addition, it is possible that a technician may be able to replace a defective component using "hot swapping" or "hot plugging" devices without either shutting down or crashing the system. This allows what is sometimes referred to as "concurrent maintenance." Current designs of rack-mount servers, however, normally use systems that retain only one card at a time. The primary reason is spatial or volumetric constraints that exist within a chassis. In fact, because of the limited space or volume within the chassis, the single card is usually required to be oriented horizontally.

SUMMARY OR THE INVENTION

The present invention provides a system that uses a plurality of electronic circuit component cards with a single motherboard or backplane. In one exemplary embodiment, the present invention comprises a card receiving system and apparatus for retaining the edges of at least two electronic circuit component cards. In this design, the present invention positions two cards horizontally so that one card is disposed above or over the other card and those two cards are oriented substantially parallel to each other.

The present invention also comprises a system in which the plurality of electronic circuit component cards may be collectively held stationarily in place relative to each other using a single positioning or retaining system.

These and other features of the card receiving system and retaining system will become more apparent from the following description taken in connection with the accompanying drawings that show, for purposes of illustration only, an exemplary embodiment in accordance with the present invention.

DETAILED DESCRIPTION OF THE PREFERRED EMBODIMENTS

Figure 1:
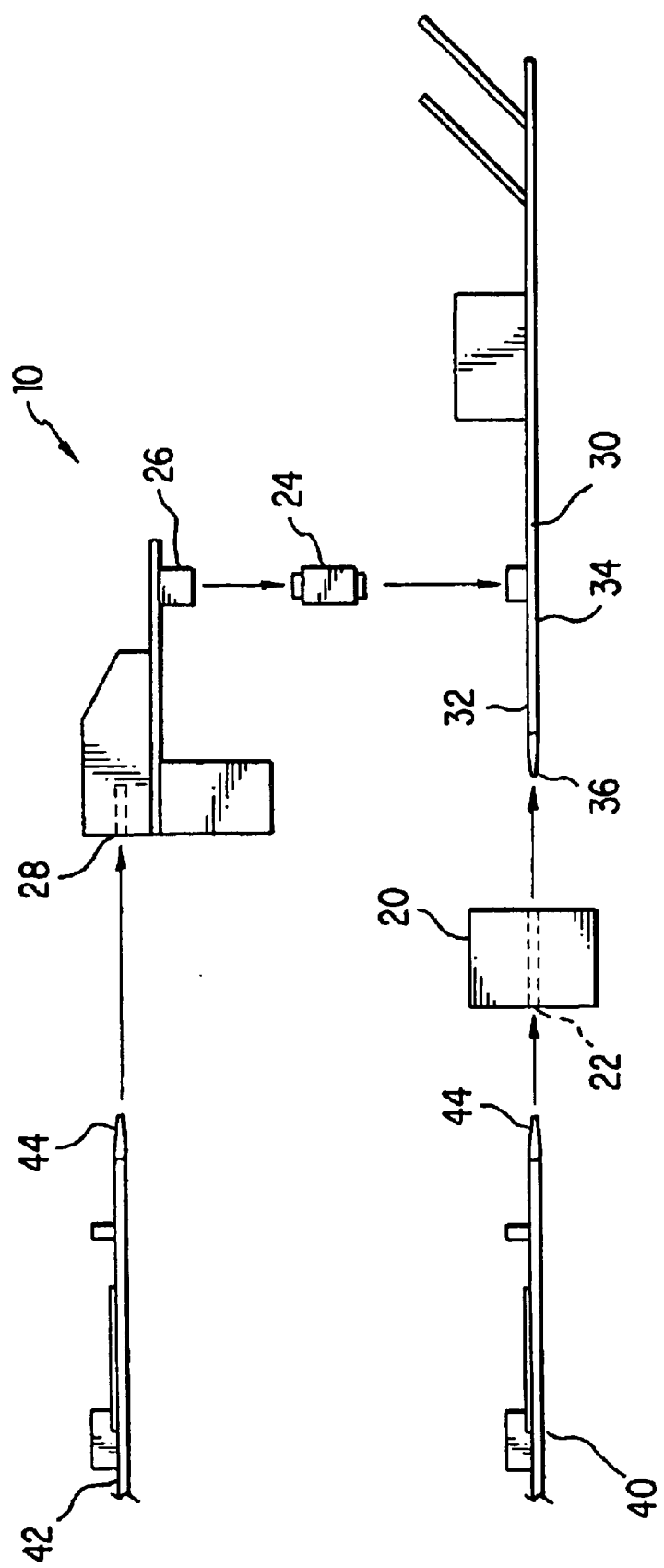
FIG. 1 is an exploded side view partially in schematic of an exemplary embodiment showing the components of the dual-card retaining device.

The present invention is more particularly described in the following examples that are intended as illustrative only since numerous modifications and variations therein will be apparent to those skilled in the art. As used in the specification and in the claims, "a," "an," or "the" can mean one or more, depending upon the context in which it is used. The preferred embodiment is now described with reference to the figures, in which like numbers indicate like parts throughout the figures.

Referring generally to FIGS. 1–4, the present invention comprises a receiving system 10 for holding and electronically communicating with at least two circuit component cards 40, 42. The drawings illustrate an exemplary embodiment that is a dual-card receiving device 10. Another aspect of the present invention includes a system that secures the cards 40, 42 in position to prevent their inadvertent removal in response to a physical shock or vibration. This securing system 50 comprises a single bracket 60 and fastener 70 to retain multiple cards.

Figure 2:
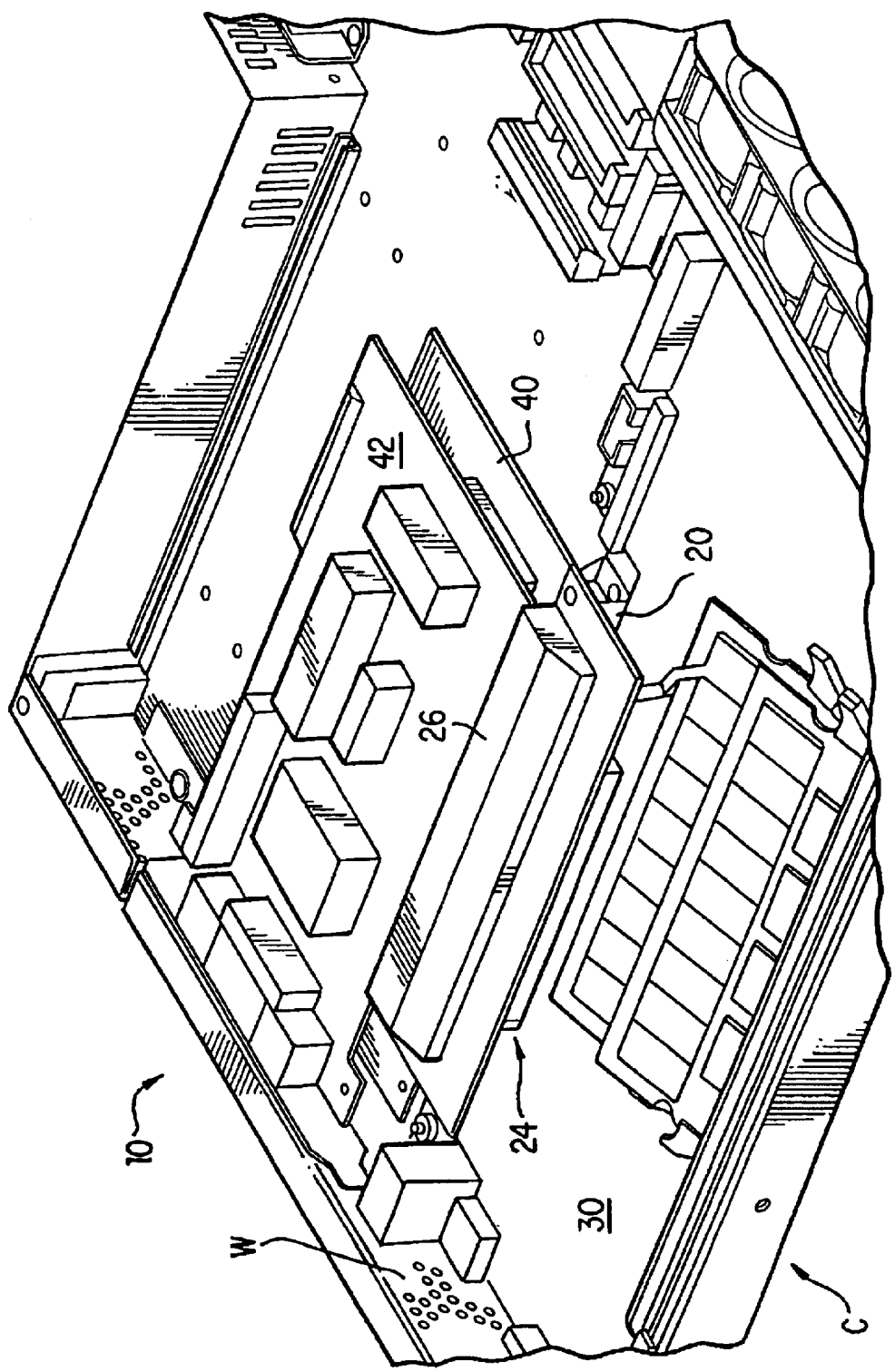
FIG. 2 is a perspective view of the dual-card retaining device of FIG. 1 positioned within a chassis.

In the exemplary embodiment illustrated in FIGS. 1–2, a dual-card receiving device 10 is shown being used with a motherboard 30 or a backplane. The motherboard 30 has an upper surface 32, a lower surface 34, and an edge 36 circumscribing at least a portion of the motherboard 30. As illustrated in FIG. 2, the motherboard 30 is substantially horizontally disposed in a chassis C.

The dual-card receiving device 10 is designed to receive two cards, a first card 40 and a second card 42. The first and second cards 40, 42 each have card edge connectors 44 for mating with respective slot connectors to create an electrical connection therebetween that allows the card to communicate electronically with the device or component to which it is connected.

Initially addressing the connection of the first card 40, a straddle connector 20 is shown attached to a portion of the edge 36 of the horizontally-disposed motherboard 30. An example of a straddle connector 20 is an edge card connector ("ECC") sold by AMCO TEC INTL., INC. having part designation number 331-184TBSNS1. As one skilled in the art will appreciate, the straddle connector 20 is typically used with a personal computer and is usually disposed upright or substantially vertically, whereas the straddle connector 20 in the exemplary embodiment illustrated in FIGS. 1 and 2 is disposed substantially horizontally. As such, the straddle connector 20 receives the first card 40 within its slot connector 22 when that first card 40 is horizontal.

One skilled in the art will also appreciate that although the straddle connector 20 is shown attached to a portion of the edge 36 of the motherboard 30, it may also be mounted on or proximate to either the upper surface 32 or lower surface 34 of the motherboard 30 near its edge 36. The straddle connector 20 may be connected or attached to the motherboard 30 (or to an adjacent structure such as a chassis C) using any means known in the art, such as chemical adhesives, fusing, mechanical fasteners, or other bonding techniques.

Still referring to FIGS. 1 and 2, the illustrated dual-card receiving device 10 also includes a riser connector 24 and a riser 26. The riser connector 24 is attached to the upper surface 32 of the motherboard 30, is located proximate the straddle connector 20, and is disposed upright. An example of a riser connector 24 is sold by AMP having part designation number 5-179009-9. The riser connector 24 is typically mounted or attached to the upper surface 32 of the motherboard 30 using a bracket (not shown) interconnecting both the riser connector 24 on one end and a mechanical fastener (not shown) on the opposed end. The mechanical fastener, such as a screw, may be connected to the motherboard 30 or the bottom of the metal casing of the underlying chassis C or rack. As one skilled in the art will further appreciate, instead of using a fastener, the riser connector 24 may be alternatively connected to the motherboard 30 or chassis C using other means known in the art, such as chemical adhesives, fusing, or other bonding techniques.

The riser 26 is coupled to the riser connector 24 so that the two components electronically communicate with the second card 42 (when received by the riser 26), the motherboard 30, and each other. An example of a riser 26 is sold by AMP having tracking or part designation number 179029-9.

Figure 1A:
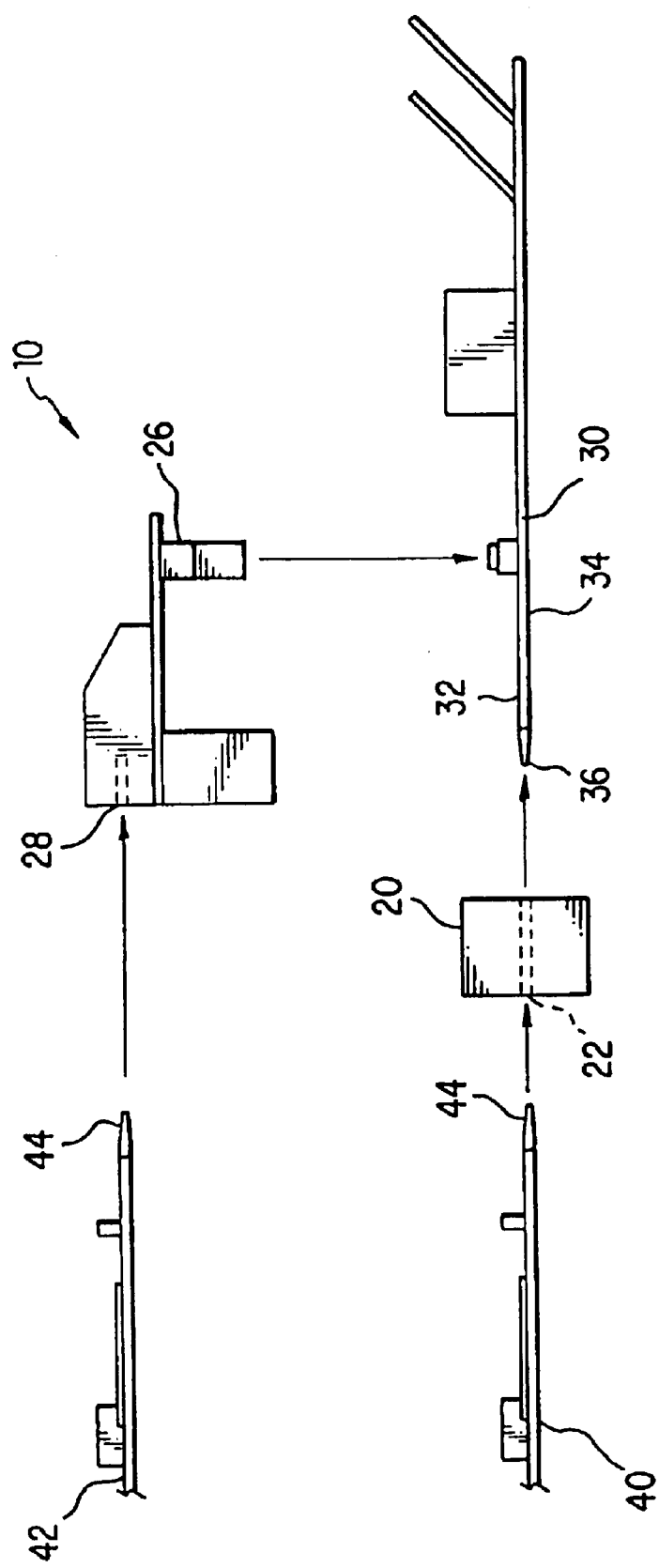
FIG. 1A is an alternative side view of FIG. 1 in which the riser connector and riser are integrally formed as a single unit.

When necessary, mechanical or chemical means may be used to buttress the physical coupling between the riser 26 and the riser connector 24 to ensure that the components are not separated as a result of vibrations or shock. Referring now to FIG. 1A, it is also contemplated that the riser connector 24 and the riser 26 may be integrally formed together so that these two components are a single device or structure, e.g., no separate riser connector would be used with the riser and that riser would be connected directly to the motherboard.

As will be noted, the illustrated riser 26 has a slot connector 28 that is horizontally oriented so that it receives the card edge connector 44 of the second card 42 when that second card is oriented substantially horizontally. As such, when the first and second cards 40, 42 are received within the respective slot connectors 22, 28 of the straddle connector 20 and riser 26, the second card 42 is disposed over or above and substantially parallel to the first card 40. In one embodiment, a standard PCI card spacing of 0.8 inches is maintained between the first and second cards 40, 42. One skilled in the art will appreciate from FIG. 2 that this design allows the mounting of two cards without substantially increasing the volume or space used in a single-card design.

Although not illustrated, it is also contemplated within the scope of the present invention to mount a third and additional cards above the first and second cards 40, 42. That is, for a third card (not shown), the additional riser connector would be farther away from the edge of the motherboard and taller than for the riser connector used with the second card. Thus, the riser for the third card would be positioned elevationally above that for the second card and the third card, when connected, would be positioned above the second card.

Addressing again the exemplary embodiment shown in FIGS. 1–2, the first and second cards 40, 42 may be the same type of cards, which provides advantageous redundancy to the system. As one skilled in the art will appreciate, if one card malfunctions or fails, the system may still continue to operate with the "good" card. Furthermore, it may be possible that a technician may be able to "hot swap" the defective card without either shutting down or crashing the system. As a specific example, the first and second cards 40, 42 may both be peripheral component interconnect ("PCI") cards. Alternatively, the first and second cards 40, 42 may be different types of cards, which increases the functionality and capability of the motherboard and, accordingly, of the system.

Now referring specifically to FIG. 2, the illustrated dual-card receiver 10 is shown contained within an Electronic Industry Association ("EIA") 1U chassis that is designed for installation in a in a system rack (not shown). The 1U chassis holds a single row of devices and has rack mounts (not shown) that are accessible so that the chassis C can easily be secured/unsecured from the rack. More specifically, in addition to the motherboard 30, the 1U chassis typically holds one or more power supply units ("PSUs") and a power distribution module ("PDM"), forming a single fully redundant central power supply section ("CPSS"). Multiple PSUs are advantageous because, having a modular design, they can be hot-swappable, in which one can be replaced while the other operates in light of their redundant configuration. The 1U chassis may also include ten drives in addition to the motherboard 30 and CPSS.

As one skilled in the art appreciates, however, there are spatial constraints within a chassis C, including its height limitation. Accordingly, the dual-card receiver 10 of the exemplary embodiment shown in FIG. 2 is designed so that the vertical separation between the lower surface 34 of the motherboard 30 and the top of the second card 42 is less than 1.75 inches, the height of a 1U chassis.

As one skilled in the art will appreciate, it is preferred that the cards be securely positioned so that shock or vibrations do not result in any of the cards 40, 42 becoming lose and dislodged from the riser 26 or the straddle connector 20 or both. A common method to achieve this objective is to use a bracket fixedly attached to the card, sometimes referred to as a tailstock, and screw that traverses through the tailstock and into the chassis C. Such designs are disclosed by the component having reference numeral "4" in U.S. Pat. No. 6,320,760 and component "110" in U.S. Pat. No. 6,030,230, both of which are incorporated herein in their entireties by reference.

Using small screws or similar fasteners to secure each of the tailstocks of the two cards may be problematic in a "hot-swap" operation because too much time is required to remove/replace such a fastener. Moreover, there is a danger that the loosened screw could fall onto powered components and potentially cause an electrical disaster. As one skilled in the art appreciates, these small screws are difficult to maneuver in the tight space even when the system is shutdown and de-energized.

Figure 3:
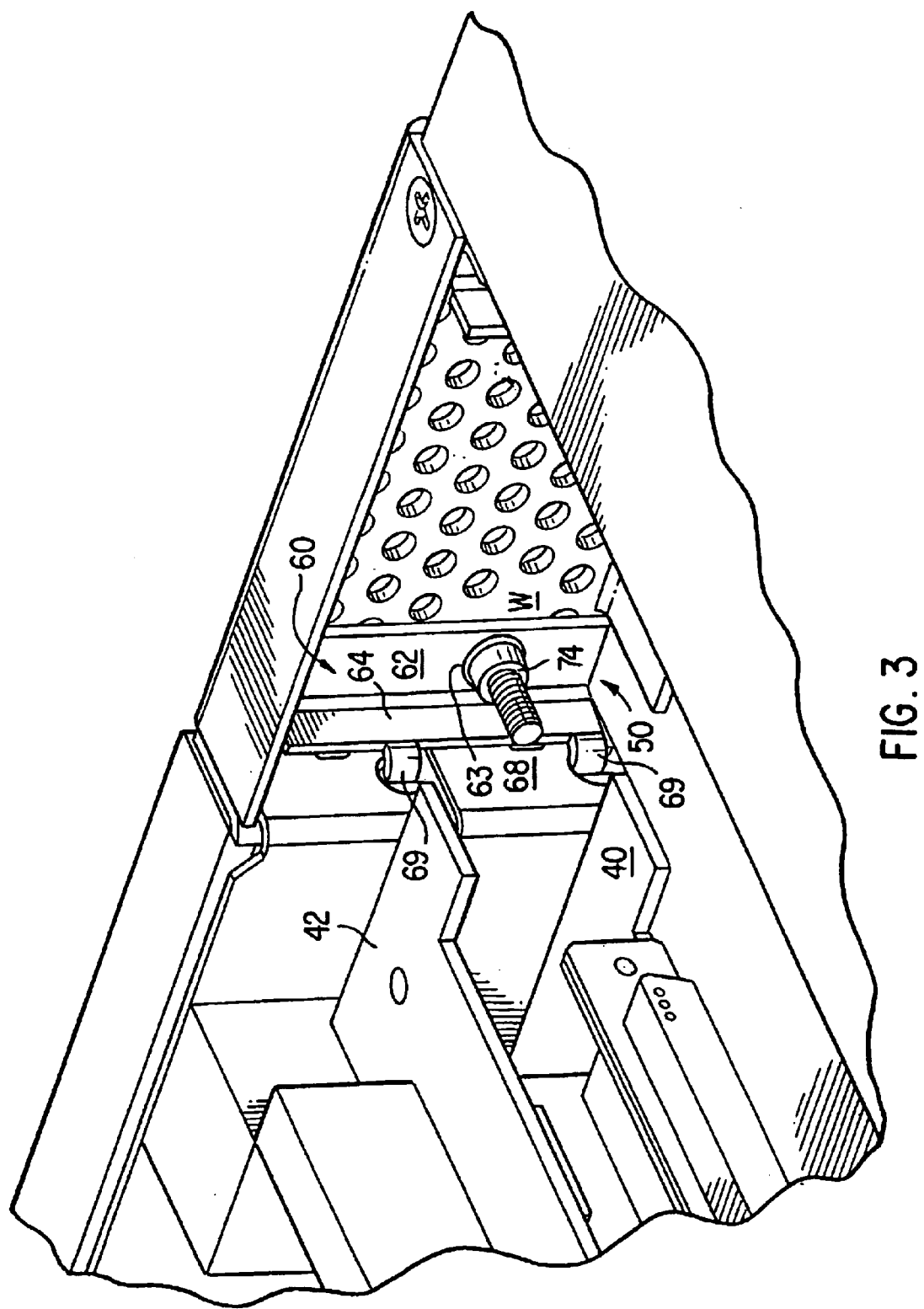
FIG. 3 is a perspective view of an exemplary embodiment of a retaining device of the present invention used to hold two cards of the dual-card retaining device.
Figure 4:
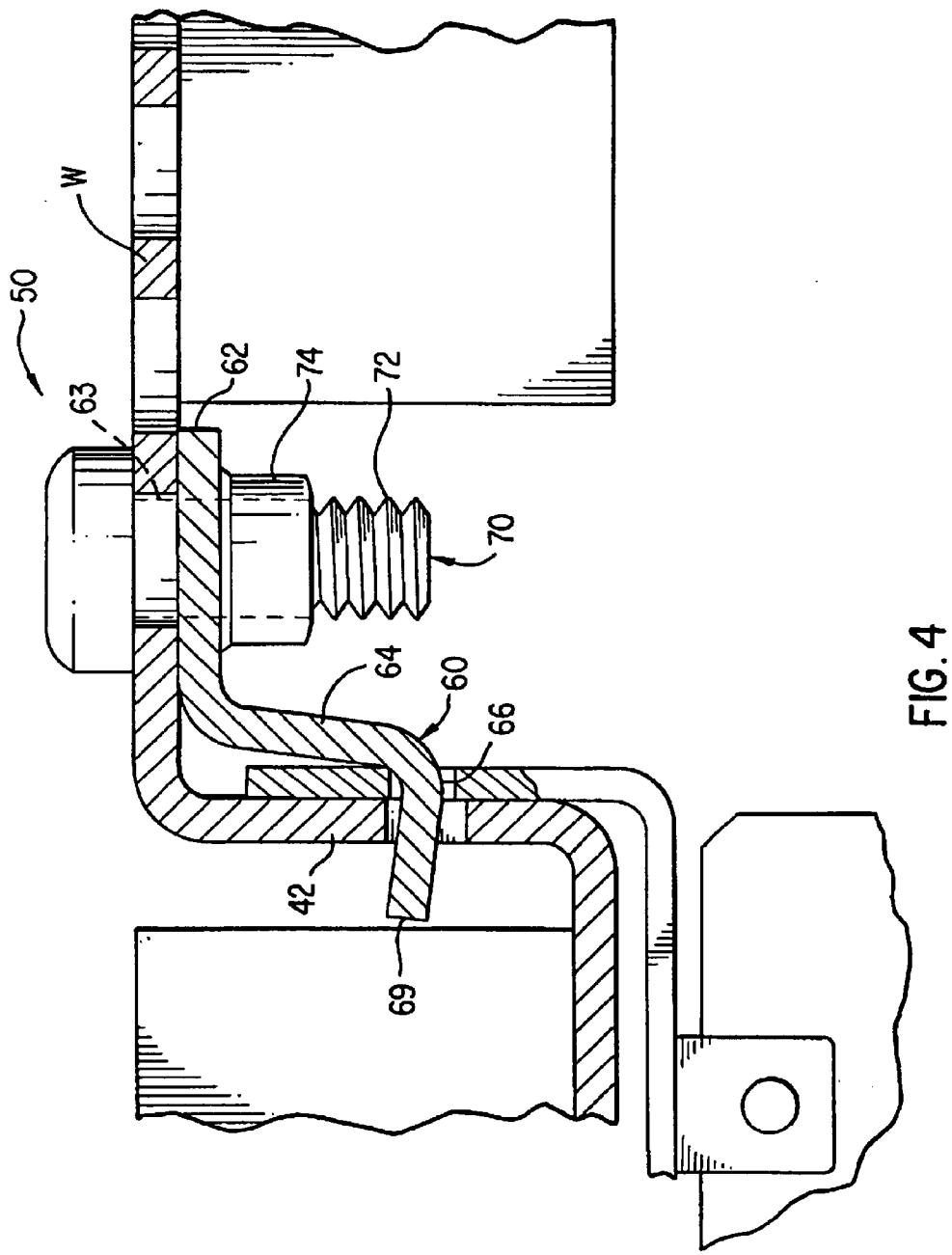
FIG. 4 is a top plan view of the retaining device shown in FIG. 3.

Referring now to FIGS. 3 and 4, the present invention also comprises a retaining device 50 or system that secures either one or all of the cards in position. The exemplary embodiment is illustrated and disclosed as being used to secure two separate cards 40, 42, which follows the disclosure above of the dual-card receiving device 10. To that end, the retaining device 50 of the present invention comprises a bracket 60 and a fastener 70.

The bracket 60 includes a securing section 62, an engaging section 66, and a connecting section 64. The securing section 62, which is shown in FIGS. 3 and 4 abutting the wall W of the chassis C or the rack case, defines an opening 63 of a size to receive a portion of the fastener 70 therethrough. As best shown in FIG. 3, a portion of the securing section 62 adjacent and surrounding the opening 63 is substantially planar.

The engaging section 66, which is spaced apart from the securing section 62, is of a dimension to complementarily engage a portion of each of the two cards, preferably the tailstock. Similar to the securing section 62 and as best shown in FIG. 4, a portion of the engaging section 66 is also substantially planar. Referring back to FIG. 3, the engaging section 66 has two opposed edges and defines a void 68 therebetween so that the engaging section 66 has two spaced-apart segments 69. As will be noted, each segment 69 is of a dimension to complementarily engage a portion of one respective card, such as the tailstock.

The connecting section 64 has a body portion extending between and interconnecting the securing and engaging sections 62, 66. The connecting section 64 is shown oriented at a non-perpendicular angle to the substantially planar portions of the securing and engaging sections 62, 66. Although not necessary, the exemplary embodiment illustrated in FIG. 4 shows that a majority of the body portion of the connecting section 64 is substantially planar. As will be noted, the substantially planar portions of the securing and engaging sections 62, 66 are oriented at non-parallel angles relative to each other, which again is best shown in FIG. 4. As will further be noted, both the transition from the securing section 62 to the connecting section 64 and the transition from the engaging section 66 to the connecting section 64 are arcuate, although a sharp angled connection is also contemplated.

Still referring to FIGS. 3 and 4, the fastener 70 is a screw 72 and a nut 74, which complementarily engages the screw 72. A portion of the fastener 70 traverses through both the opening 63 of the securing section 62 and the wall W of the rack or chassis C. One skilled in the art will appreciate that the nut 74 is optional when the opening 63 of the securing section 62 includes a threaded surface to complementarily engage the threaded surface of the screw 72. Although less preferred, other fasteners that detachably hold the bracket 60 may be used.

As the screw 72 is tightened, the substantially planar portion of the securing section 62 of the bracket 60 is drawn or pulled toward the wall W. As this occurs, the two spaced-apart segments 69 of the engaging section 66 correspondingly first engage and then secure the tailstock of the two respective cards. The connecting section 64 in the exemplary embodiment being at a non-perpendicular angle with the substantially planar sections of the assists the technician in connecting the components in the tight space. Also, the bracket 60 may pivot about the fastener 70 as it is tightened to position properly the components if the technical has difficulty in pre-positioning the bracket 60 and tailstock of the cards located within the chassis C.

As one skilled in the art will also appreciate, the screw 72 used in FIGS. 3 and 4 is started or fed from a position outside of the interior of the rack or chassis C. Accordingly, if the screw 72 is inadvertently dropped, then the chances of adversely affecting the system decrease significantly. It may also be easier for the technician to maneuver the components and tighten the screw 72 since its head is positioned outside the wall W. Having the ability to secure more than one card at one time with a single screw 72 may additionally result in time savings to the technician when initially installing or changing cards.

Although the present invention has been described with reference to specific details of certain embodiments thereof, it is not intended that such details should be regarded as limitations upon the scope of the invention except as and to the extent that they are included in the accompanying claims. For example, one skilled in the art will appreciate that the retaining device 50 of the present invention may be used in other contexts besides the dual-card retaining device 10 and, likewise, the dual-card retaining device 10 may be used without the disclosed retaining device 50 or in a system other than a server shown, for example, in FIG. 2.

What is claimed is:

1. A receiving device, comprising:
   a. a motherboard being horizontally disposed,
   b. a straddle connector directly mounted to the motherboard and the straddle connector being disposed to receive a first card that is oriented substantially horizontally;
   c. a riser connector spaced apart from and located closely adjacent and next to the straddle connector and disposed upright; and
   d. a riser coupled to the riser connector and disposed to receive a second card that is oriented substantially horizontally,
   wherein, when the first and second cards are received within the straddle connector and riser respectively, a portion of the second card is disposed directly above a portion of the first card,
   wherein no portion of the second card is disposed both over and above the motherboard and wherein no portion of the first card is disposed both over and above the motherboard.

2. The receiving device of claim 1, wherein the riser connector and the riser are integrally formed.

3. The receiving device of claim 1, wherein the motherboard has an upper surface, a lower surface, and an edge,
   wherein the straddle connector is mounted to a portion of the edge of the motherboard so that the first card extends away from the edge of the motherboard, and
   wherein the riser connector is attached to the upper surface of the motherboard so that the second card, received within the riser coupled to the riser connector, also extends away from the motherboard elevationally above and spaced apart from the first card.

4. The receiving device of claim 3, wherein the bottom of the motherboard and the second card are vertically spaced apart a distance less than 1.75 inches.

5. The receiving device of claim 1, further comprising a retaining device for stationarily positioning the first and second cards.

6. A receiving device, comprising:
   a. a motherboard being horizontally disposed,
   b. a straddle connector directly mounted to the motherboard and the straddle connector being disposed to receive a first card that is oriented substantially horizontally; and c. a riser spaced apart from and located closely adjacent and next to the straddle connector and disposed to receive a second card that is oriented substantially horizontally, wherein, when the first and second cards are received within the straddle connector and riser respectively, a portion of the second card is disposed directly above a portion of the first card, wherein no portion of the second card is disposed both over and above the motherboard and wherein no portion of the first card is disposed both over and above the motherboard.

7. The receiving device of claim 6, wherein the motherboard has an upper surface, a lower surface, and an edge, wherein the straddle connector is mounted to a portion of the edge of the motherboard so that the first card extends away from the edge of the motherboard, and wherein the riser is attached to the upper surface of the motherboard so that the second card, received within the riser, also extends away from the motherboard elevationally above and spaced apart from the first card.

8. The receiving device of claim 7, wherein the bottom of the motherboard and the second card are vertically spaced apart a distance less than 1.75 inches.

9. The receiving device of claim 6, further comprising a retaining device for stationarily positioning the first and second cards.

10. A dual-card receiving device, comprising:
a. a motherboard having an upper surface and an edge, the motherboard being substantially horizontally disposed;
b. a first card;
c. a straddle connector directly mounted to the edge of the motherboard, the straddle connector receiving the first card when that first card is oriented substantially horizontally;
d. a second card;
e. a riser connector attached to the upper surface of the motherboard and spaced apart from the straddle connector, the riser connector disposed upright; and f. a riser coupled to the riser connector that receives the second card when that second card is oriented substantially horizontally, wherein, when the first and second cards are received within the straddle connector and riser respectively, a portion of the second card is disposed directly over a portion of the first card, wherein no portion of the second card is disposed both over and above the motherboard and wherein no portion of the first card is disposed both over and above the motherboard.

11. The dual-card receiving device of claim 10, wherein the riser connector and the riser are integrally formed.

12. The dual-card receiving device of claim 10, wherein the first and second cards are the same type of cards.

13. The dual-card receiving device of claim 12, wherein the first and second cards are each PCI cards.

14. The dual-card receiving device of claim 10, wherein the first and second cards are different types of cards.

15. The dual-card receiving device of claim 10, wherein the motherboard has a lower surface and the second card has a top, and
wherein the lower surface of the motherboard and the top of the second card are vertically spaced apart a distance less than 1.75 inches.

16. The dual-card receiving device of claim 10, wherein the straddle connector is mounted onto a portion of the edge of the motherboard.

17. The dual-card receiving device of claim 10, further comprising a retaining device for stationarily positioning the first and second cards.

18. A receiving device, comprising:
a. a straddle connector disposed to receive a first card that is oriented substantially horizontally;
b. a riser connector spaced apart from the straddle connector and disposed upright; and
c. a riser coupled to the riser connector and disposed to receive a second card that is oriented substantially horizontally; and
d. a motherboard having an upper surface, a lower surface, and an edge, the motherboard being horizontally disposed, wherein, when the first and second cards are received within the straddle connector and riser respectively, the second card is disposed above and substantially parallel to the first card, wherein the straddle connector is directly mounted to a portion of the edge of the motherboard so that the first card extends away from the edge of the motherboard, and wherein the riser connector is attached to the upper surface of the motherboard so that the second card, received within the riser coupled to the riser connector, also extends away from the motherboard so that a substantial portion of the second card is not disposed over and above the motherboard and so that the second card is elevationally above and spaced apart from the first card, wherein no portion of the second card is disposed both over and above the motherboard and wherein no portion of the first card is disposed both over and above the motherboard.

19. A receiving device, comprising:
a. a straddle connector disposed to receive a first card that is oriented substantially horizontally;
b. a riser spaced apart from the straddle connector and disposed to receive a second card that is oriented substantially horizontally; and
c. a motherboard having an upper surface, a lower surface, and an edge, the motherboard being horizontally disposed, wherein, when the first and second cards are received within the straddle connector and riser respectively, the second card is disposed above and substantially parallel to the first card, wherein the straddle connector is directly mounted to a portion of the edge of the motherboard so that the first card extends away from the edge of the motherboard, and wherein the riser is attached to the upper surface of the motherboard so that the second card, received within the riser, also extends away from the motherboard so that a substantial portion of the second card is not disposed over and above the motherboard and so that the second card is elevationally above and spaced apart from the first card, wherein no portion of the second card is disposed both over and above the motherboard and wherein no portion of the first card is disposed both over and above the motherboard.

20. The receiving device of claim 19, wherein the bottom of the motherboard and the second card are vertically spaced apart a distance less than 1.75 inches.

* * * * *